US010466325B2

(12) United States Patent
Greiser et al.

(10) Patent No.: US 10,466,325 B2
(45) Date of Patent: Nov. 5, 2019

(54) RECOGNITION OF REPETITION PATTERNS IN MR SEQUENCES

(71) Applicants: Andreas Greiser, Erlangen (DE); David Grodzki, Erlangen (DE); Daniel Nico Splitthoff, Erlangen (DE)

(72) Inventors: Andreas Greiser, Erlangen (DE); David Grodzki, Erlangen (DE); Daniel Nico Splitthoff, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 73 days.

(21) Appl. No.: 15/657,343

(22) Filed: Jul. 24, 2017

(65) Prior Publication Data
US 2018/0052212 A1   Feb. 22, 2018

(30) Foreign Application Priority Data
Aug. 17, 2016  (DE) .......... 10 2016 215 325

(51) Int. Cl.
| *G01V 3/00* | (2006.01) |
| *G01R 33/54* | (2006.01) |
| *G01R 33/30* | (2006.01) |
| *G01R 33/385* | (2006.01) |
| *G01R 33/28* | (2006.01) |
| G01R 33/36 | (2006.01) |

(52) U.S. Cl.
CPC ......... *G01R 33/543* (2013.01); *G01R 33/288* (2013.01); *G01R 33/307* (2013.01); *G01R 33/385* (2013.01); *G01R 33/546* (2013.01); *G01R 33/36* (2013.01)

(58) Field of Classification Search
CPC .......... G01R 33/5608; G01R 33/543; G01R 33/3815; G01R 33/3804; A61B 5/055
USPC ......................................... 324/322
See application file for complete search history.

(56) References Cited

U.S. PATENT DOCUMENTS

| 2007/0092515 | A1* | 4/2007 | Weaver | A61K 39/39541 424/144.1 |
| 2014/0232407 | A1* | 8/2014 | Nakamura | G01R 33/3607 324/322 |
| 2016/0091588 | A1 | 3/2016 | Benner et al. | |
| 2016/0103195 | A1* | 4/2016 | Zuehlsdorff | G01R 33/543 324/309 |

FOREIGN PATENT DOCUMENTS

DE   102014219785 A1   3/2016

OTHER PUBLICATIONS

Ferman Search Report for German Patent Application No. 10 2016 215 325.0 dated Jun. 13, 2019.

* cited by examiner

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

The disclosure relates to a method for determining a sequence information element of a magnetic resonance sequence, a computer program product and an evaluation unit for performing such a method, and also a magnetic resonance device having such an evaluation unit. The method includes a determination of the sequence information element based on at least one pattern of the magnetic resonance sequence.

14 Claims, 3 Drawing Sheets

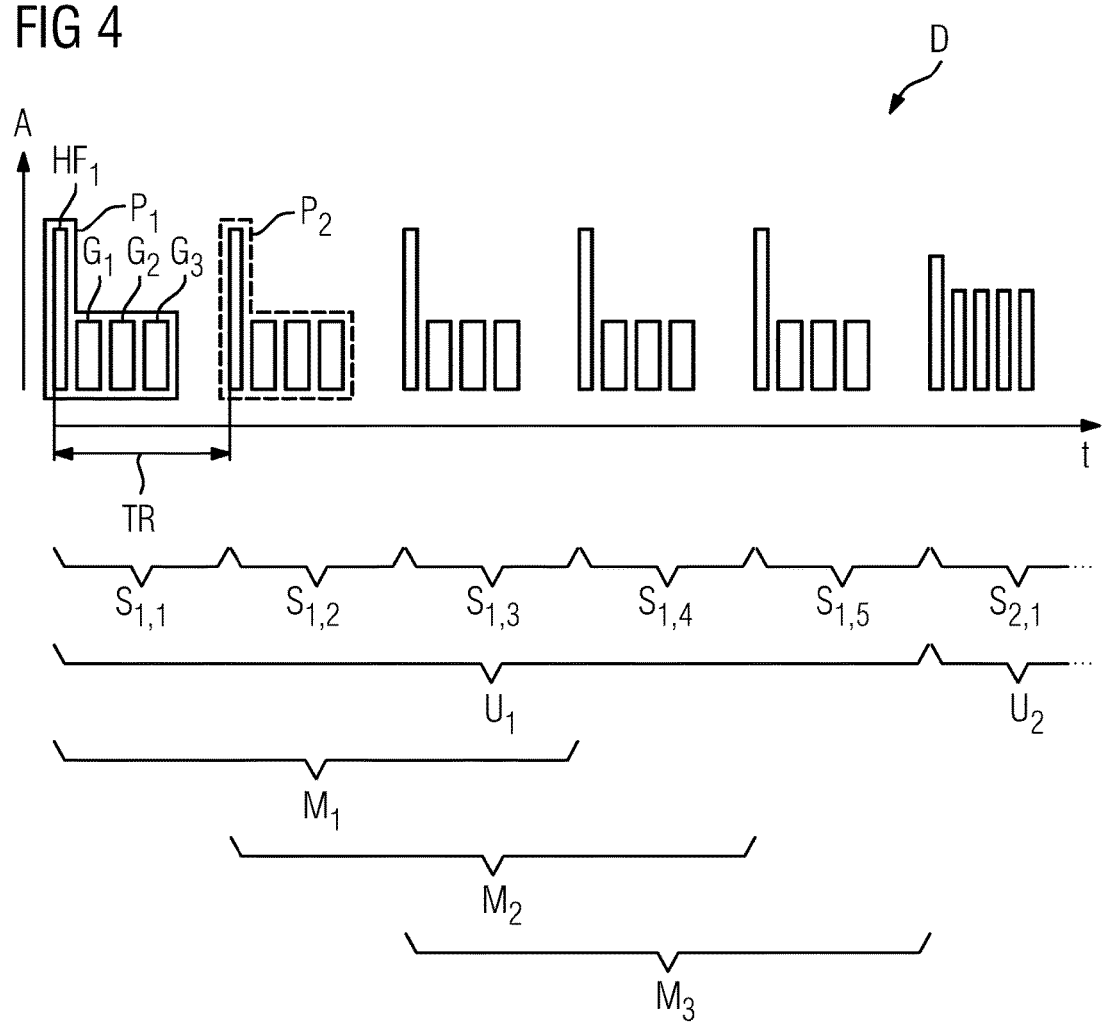

RECOGNITION OF REPETITION PATTERNS IN MR SEQUENCES

The application claims the benefit of German Patent Application No. DE 10 2016 215 325.0, filed Aug. 17, 2016, which is hereby incorporated by reference in its entirety.

TECHNICAL FIELD

The disclosure relates to a method for determining a sequence information element of a magnetic resonance sequence, a computer program product and an evaluation unit for performing such a method, and also a magnetic resonance device having such an evaluation unit.

BACKGROUND

Magnetic resonance tomography (MRT) or magnetic resonance imaging (MRI) is a known technology for generating images of the interior of the body of a patient based on the physical phenomenon of magnetic resonance (MR). An MR measurement may include a temporal series of rapidly switched gradient pulses and radiofrequency (RF) pulses, which may be defined by an MR sequence.

As a general rule, the gradient pulses are generated during an MR measurement by a gradient coil unit of an MR device and superimposed on a static constant magnetic field. The gradient pulses may cause peripheral nerve stimulations (PNS) in a patient under examination. The RF pulses may be generated by a radiofrequency antenna unit of the MR device and are irradiated into the patient in order to trigger MR signals. The energy of the RF pulses absorbed in this situation per unit of time and per kilogram of body weight is normally referred to as the specific absorption rate (SAR). The absorption of the RF energy may lead to a warming of the body tissue of the patient.

In order to avoid endangering the patient, standardization bodies require that MR measurements comply with strict limit values in respect of their effects. In order to prevent interruptions as a result of exceeding the limit values during the MR measurement, compliance with the limit values may be estimated prior to commencement of the MR measurement. The estimation may be parameterized by a sequence developer defining time ranges to be checked, for example, directly in the code of the MR sequence in order for instance to estimate the nerve stimulations of the patient and/or to calculate the energy absorbed by the patient. On account of a plurality of possible input parameters that influence the MR sequence, the parameterization is not trivial and is therefore also error-prone.

In addition to the limitations described in regard to examining the patient safely, limit values moreover need to be observed which are given by the performance capability of the MR device. For example, the gradient coil unit may only generate a restricted gradient field and the radiofrequency antenna unit may only generate a restricted $B_1$ field.

SUMMARY AND DESCRIPTION

The object of the disclosure is to rapidly and reliably determine a sequence information element, which in particular relates to one or more variables of an MR sequence restricted by limit values.

The scope of the present disclosure is defined solely by the appended claims and is not affected to any degree by the statements within this description. The present embodiments may obviate one or more of the drawbacks or limitations in the related art.

Accordingly, a method for determining a sequence information element of an MR sequence is proposed wherein the method includes a determination of the sequence information element based on at least one pattern of the MR sequence.

The determination of the sequence information element may take place with the aid of an evaluation unit, which in particular has a processor and/or a memory. The MR sequence may be supplied with the aid of a supply unit, such as a database that passes the MR sequence to the evaluation unit.

The MR sequence may be described with the aid of sequence parameters. The MR sequence may be simulated over its entire extent, in other words the complete MR sequence may be prepared based on the sequence parameters.

In particular, a sequence diagram may thereby be created, in other words the result of such a simulation and/or preparation may be a similar sequence diagram. A sequence diagram may exhibit a plurality of sampling points with which one or more values of the MR sequence, (e.g., an amplitude of an RF pulse and/or of a gradient pulse), are associated.

The patterns of the simulated and/or prepared MR sequence and/or of the resulting sequence diagram may then be employed for the determination of the sequence information element.

A pattern may be understood as being an in particular periodic and/or repeating structure. The at least one pattern of the MR sequence may include a periodic and/or repeating series of gradient pulses and/or RF pulses. The series of gradient pulses and/or RF pulses may furthermore exhibit similarities and/or regularities.

In this situation, the disclosure takes advantage of the fact that the execution flow of the MR measurement defined by the MR sequence may obey strict regularities that may be implemented by way of a plurality of interleaved loops. The execution flow may include partial modules brought into play regularly at certain points in time or in the case of certain loops. As a result of recognition of these patterns, it is possible to avoid a time-consuming evaluation of the complete MR sequence in order to determine the desired sequence information element.

The sequence information element may include at least one limiting variable, which may characterize an absorption rate, such as a specific absorption rate and/or a nerve stimulation, (e.g., a peripheral nerve stimulation). These are particularly important variables for the safe operation of an MR device, as already explained above.

Alternatively, or in addition to these patient-related aspects, the at least one limiting variable may also concern hardware-related considerations. The at least one limiting variable may thus also characterize a limit of an MR device, in particular a strength of a gradient field and/or a gradient rise rate and/or a strength of a $B_1$ field. The strength of the gradient field and of the gradient rise rate may be limited by the gradient coil unit of the MR device while the strength of the $B_1$ field is limited by the radiofrequency antenna unit. The sequence information element may include the alternating magnetic fields generated by the radiofrequency antenna unit, e.g., an averaged $B_1$ field $B_{1,average}$ and/or a peak $B_1$ field $B_{1,peak}$. By taking into consideration these parameters relevant to performance, the MR sequence may be checked on-the-fly to ascertain whether the limits of the MR device are being observed. This enables a more effective utilization of the MR device.

The at least one pattern may be determined based on the MR sequence and/or based on a supplementary information element. In the case of a determination of the at least one pattern based on the MR sequence, possible regularities of the MR sequence may be analyzed and/or recognized automatically. Supplementary information elements may include prior knowledge and/or information elements, which in particular contain a parameterization of repeating loops. Furthermore, the supplementary information elements may include a metric, in which ranges of the MR sequence the patterns relevant to the determined sequence information element are repeated, in order to prevent a change in the sequence information element from leading to an incorrect estimation of the sequence information element over the course of the MR sequence.

In order to simplify the estimation of the sequence information element, the fact that certain repetitions are basically identical in respect of the parameters evaluated may also be supplied to the MR sequence or to the sequence diagram as a supplementary information element, for example. It is thus possible, for example, to assume that a phase encoding used for the position encoding causes a multiplication of the sampling pattern in respect of the $B_1$ parameters, in particular on the assumption that no technologies having a variable flip angle, such as Sampling Perfection with Application optimized Contrasts using different flip angle Evolution (SPACE) or Variable Flip Angle-Fast Low Angle Shot (VFA-FLASH), are considered.

A combination of supplementary information elements and automatic analysis is also possible.

The analysis of the MR sequence may be stopped as soon as the at least one pattern is recognized. With the aid of the recognized pattern, it is possible to extrapolate to the complete course of the MR sequence.

The determination of the sequence information element may be terminated after a defined time. If, for example, no pattern is recognized within a certain period, the method may be terminated. Excessively long calculation times may thereby be avoided and the desired sequence information element may instead be determined in a conventional manner without the use of a pattern.

The defined time may, for example, be entered by an operator of the MR device and/or be saved in a memory, from which the defined time may be made available to the evaluation unit.

An embodiment provides that a first subsection information element and a first pattern are determined for at least a first subsection of the MR sequence. In this situation, the sequence information element is determined based on an extrapolation of the first subsection information element to a section of the MR sequence if the determined pattern is repeated at least once in the section of the magnetic resonance sequence. Such an extrapolation, which as a general rule is based on the assumption that the patterns are repeated regularly, may greatly accelerate the determination of the sequence information element.

A section may include at least one subsection, in other words a subsection is normally a subset of a section. Such an organization of the MR sequence in sections and subsections advantageously illustrates the construction of the MR sequence that may have one or more loops possibly interleaved.

The smallest repeating structure of an MR sequence is normally encompassed by one repetition time (TR).

A subsection may be limited temporally by at least one repetition time, less than ten repetition times, or precisely one repetition time. The repetition time is as a general rule the time between two RF excitation pulses. Within the TR interval, depending on the measurement technology, mostly MR signals having, for example, one or more phase encodings are captured.

The subsection information element may include a sequence information element valid for the respective subsection.

If, for example, a subsection information element is determined for the first repetition time and in addition a pattern is detected, which is found again in a second repetition time, the first subsection information element may be extrapolated to the second and also further repetition times of the section.

As explained above, a sampling point of a sequence diagram may be understood as being a point in time with which one or more values of the MR sequence are associated. The first subsection may include a plurality of, in particular sequential, sampling points each having one or more values of the MR sequence, from which a first pattern may be determined.

Following a determination of a repetition of the first pattern in the section of the MR sequence, a further pattern of a further subsection within the section of the MR sequence may be determined and compared with the first pattern. It is thereby possible to provide the validity of the assumption in respect of the recurrence of the pattern series and to update the pattern as necessary.

The further subsection is advantageously selected in randomized fashion. In other words, the pattern of the MR sequence is evaluated on a sample basis and thereby checked particularly reliably.

A section may include at least one section window having a plurality of subsections. A subsection information element may be determined in each case for the plurality of subsections, in particular by extrapolation of the first subsection information element. The subsection information elements of the subsections, which are encompassed by a section window, may be averaged. The section windows constitute averaging windows in this case.

The section windows of a section may also encompass common subsections. In other words, the section windows may also overlap one another.

Furthermore, an evaluation unit for performing a method for determining the sequence information element of an MR sequence is proposed. The evaluation unit may include one or more processors and/or a memory.

The advantages of the evaluation unit correspond to the advantages of the method for determining the sequence information element of an MR sequence, which are explained above in detail. Features, advantages, or alternative embodiments mentioned here may likewise also be transferred to the other claimed subject matters and vice versa.

The evaluation unit may be embodied to be integrated into an MR device and/or include a data interface configured in order to transfer data to an MR device. It is also conceivable that the checking unit operates independently of an MR device.

In addition, an MR device includes an evaluation unit configured to perform a method for determining the sequence information element of an MR sequence. The MR device may include a system control unit in order to control the MR device, which in turn includes the evaluation unit.

Furthermore, a computer program product includes a computer program and may be loaded directly into a memory of a programmable computing unit of an evaluation unit and program resources, (e.g., libraries and auxiliary functions), in order to perform a method for determining the sequence information element of an MR sequence when the computer program product is executed in the evaluation unit. In this situation, the computer program product may include software having source code that still needs to be compiled and linked or which only needs to be interpreted, or executable software code that only needs to be loaded into the corresponding computing unit for execution. The method for determining the sequence information element of an MR sequence may be performed quickly, in an identically repeatable manner and robustly by the computer program product. The computer program product is configured such that it may perform the method acts by the evaluation unit. In this situation, the evaluation unit includes the respective requirements, (e.g., an appropriate main memory, an appropriate graphics card, or an appropriate logic unit), in order that the respective method acts may be performed efficiently.

BRIEF DESCRIPTION OF THE DRAWINGS

Further advantages, features and details of the disclosure will emerge from the exemplary embodiments described in the following and with reference to the drawings. Parts corresponding to one another are identified by the same reference characters in all the figures. In the drawings:

FIG. 4 depicts an exemplary sequence diagram.

DETAILED DESCRIPTION

Figure 1:
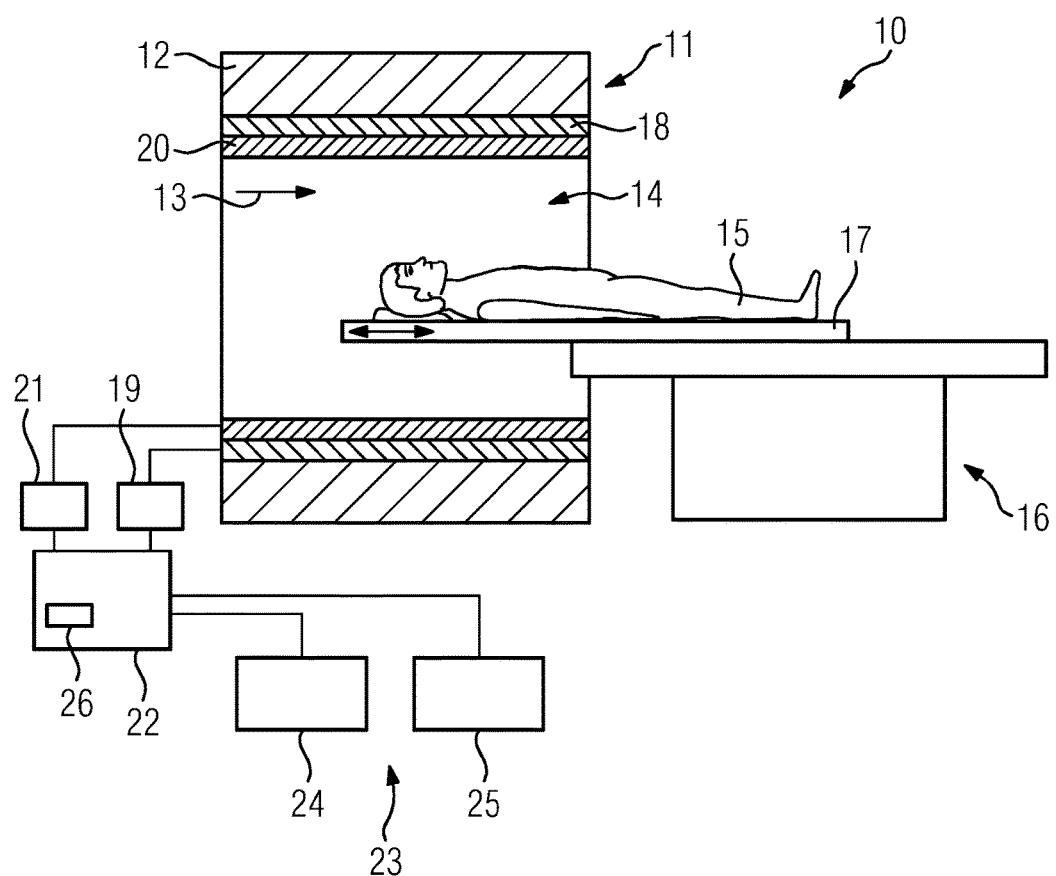
FIG. 1 depicts a schematic diagram of an exemplary MR device.

FIG. 1 illustrates an MR device 10 schematically. The MR device 10 includes a magnet unit 11, which includes a main magnet 12 for generating a strong and in particular temporally constant main magnetic field 13. The MR device 10 furthermore has a patient receiving area 14 for receiving a patient 15. The patient receiving area 14 in the present exemplary embodiment is cylindrical in design and is surrounded in cylindrical fashion in a circumferential direction by the magnet unit 11. In principle, a design of the patient receiving area 14 differing therefrom is conceivable at any time. The patient 15 may be pushed into the patient receiving area 14 by a patient positioning device 16 of the MR device 10. To this end, the patient positioning device 16 has a patient examination table 17 designed to be capable of movement within the patient receiving area 14.

The magnet unit 11 furthermore has a gradient coil unit 18 in order to generate gradient pulses, which are used for position encoding during imaging. The gradient pulses may cause a nerve stimulation in the patient 15. The gradient coil unit 18 is controlled by a gradient control unit 19 of the magnetic resonance device 10. The gradient coil unit 18 is as a general rule designed for only up to a limited gradient strength and/or gradient rise rate.

The magnet unit 11 furthermore includes a radiofrequency antenna unit 20, which, in the present exemplary embodiment, is designed as a body coil fixedly integrated into the MR device 10. The radiofrequency antenna unit 20 is designed in order to excite atomic nuclei with the aid of RF pulses, which excitation occurs in the main magnetic field 13 generated by the main magnet 12. The RF pulses are therefore at least partially absorbed by the patient 15, with the result that a warming of the patient may occur. The absorption of the RF pulses by the patient 15 may be described by an absorption rate. The radiofrequency antenna unit 20 is controlled by a radiofrequency antenna control unit 21 of the MR device 10. The radiofrequency antenna unit 20 is furthermore designed in order to receive MR signals. The performance capability of the radiofrequency antenna unit 20 is limited in particular in respect of the $B_1$ field, which may be generated thereby in the patient receiving area 14.

The MR device 10 has a system control unit 22 in order to control the main magnet 12, the gradient control unit 19, and the radiofrequency antenna control unit 21. The system control unit 22 provides central control of the reconstruction 10, in particular performing a predetermined imaging MR sequence. The system control unit 22 moreover includes a reconstruction unit (not shown in detail) for reconstructing medical image data acquired during the MR examination. The MR device 10 furthermore includes a user interface 23 connected to the system control unit 22. Control information, (e.g., imaging parameters and also reconstructed MR images), may be displayed on a display unit 24, (e.g., at least one monitor), of the user interface 23 for a medical operator. The user interface 23 furthermore has an input unit 25 that may be used by the medical operator to enter information and/or parameters during a measurement operation.

The MR device 10 furthermore includes an evaluation unit 26 having a computing unit, which may have one or more processors and/or a memory, for performing a method for determining the sequence information element of an MR sequence. A program may be loaded into the memory of the programmable computing unit, with program resources, in order to perform a method for determining the sequence information element of an MR sequence when the program is executed in the computing unit.

Figure 2:
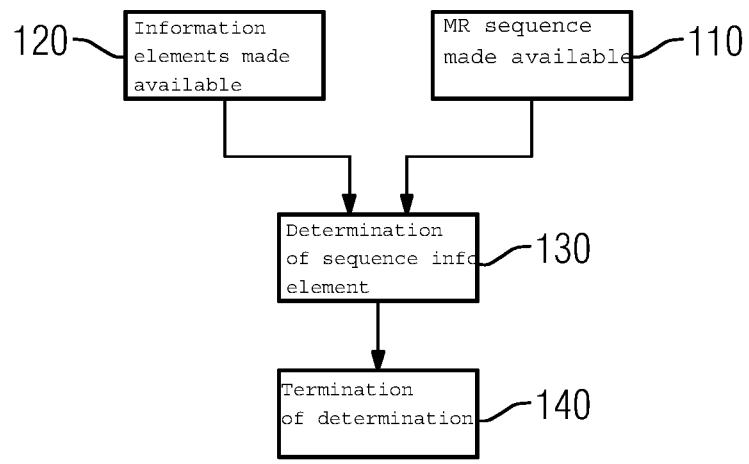
FIG. 2 depicts an exemplary block diagram of a method.

FIG. 2 depicts a block diagram illustrating a possible method for determining the sequence information element of an MR sequence. In act 110, an MR sequence is made available to the evaluation unit 26. In act 130, a sequence information element is determined by the evaluation unit 26 based on a pattern in the MR sequence. The sequence information element advantageously includes at least one limiting variable, which, for example, characterizes an absorption rate and/or a nerve stimulation and/or at least one limit of the MR device 10, in particular of the gradient coil unit 18 and/or of the radiofrequency antenna unit 20. Should the determination of the sequence information element last too long, the determination may be terminated after a defined time (act 140). This time may be entered by the input unit 25 and/or be stored permanently in the evaluation unit 26.

The at least one pattern is determined based on the MR sequence made available in act 110. Optionally, supplementary information elements, made available in act 120, (e.g., prior knowledge of the MR sequence), may also be used in order to determine the at least one pattern.

Act 130 may include a simulation of the, (e.g., entire), MR sequence. A sequence diagram D may result from such a simulation, as is shown by way of example and in part in FIG. 4. It may be seen from this illustration that the execution flow of an MR measurement normally obeys strict regularities. The MR sequence and/or the sequence diagram derived therefrom thus includes a plurality of sections $U_1$, $U_2$, where in this example the section $U_1$ may be divided into repeating subsections $S_{1,1}$, $S_{1,2}$, $S_{1,3}$, $S_{1,4}$, $S_{1,5}$. In this situation, the subsections $S_{1,1}$, $S_{1,2}$, $S_{1,3}$, $S_{1,4}$, $S_{1,5}$ in each case show the length of a repetition time TR on the time axis t. The time points on time axis may also be understood as being sampling points of the sequence diagram D.

The sequence diagram D furthermore includes an amplitude axis A, on which, for example, amplitudes of the RF pulses $HF_1$ and/or gradient pulses $G_1$, $G_2$, $G_3$ predefined by the MR sequence are plotted. The series of the RF pulses $HF_1$ and/or gradient pulses $G_1$, $G_2$, $G_3$ forms a pattern $P_1$, which here is identical to the pattern $P_1$ of subsection $S_{1,2}$ and also to those of subsections $S_{1,3}$, $S_{1,4}$, and $S_{1,5}$.

Figure 3:
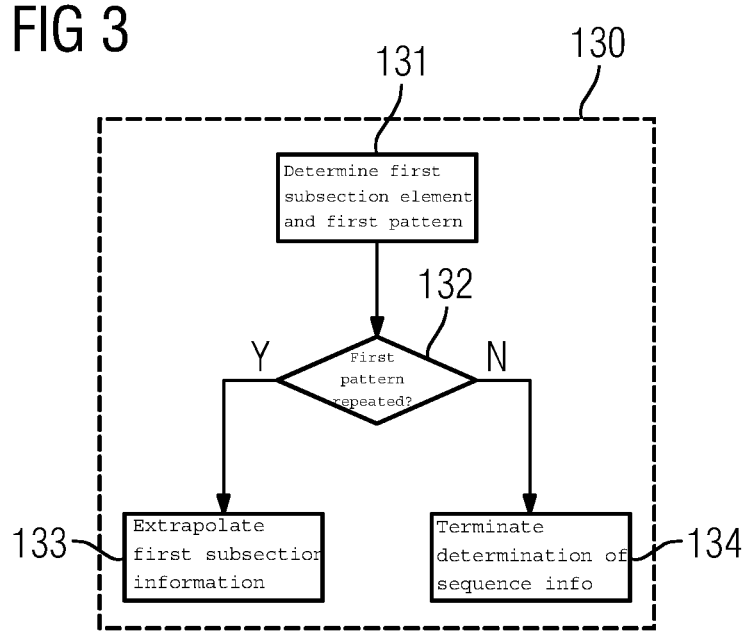
FIG. 3 depicts an exemplary block diagram of an additional method.

FIG. 3 depicts how the information elements illustrated in FIG. 4 may be advantageously processed during the determination of the sequence information in act 130. In act 131, a first subsection information element and a first pattern, here $P_1$, are determined for at least one first subsection, here $S_{1,1}$, of the MR sequence. The first subsection may be the first temporally here. Alternatively, the first subsection may have a position other than the first in the temporal series of subsections in the section. Advantageously, each subsection of the at least one first subsections includes less than ten TRs, as in this case, precisely one TR.

In act 132, a check is made as to whether the determined first pattern $P_1$ in the section $U_1$ of the MR sequence is repeated at least once. This is the case in the example illustrated in FIG. 4 because the pattern $P_1$ is repeated in the section $U_1$, more precisely in the subsection $P_{1,2}$.

If the determined first pattern is therefore repeated at least once in the section of the MR sequence, in act 133, the sequence information element is determined based on an extrapolation of the first subsection information element to the section $U_1$ of the MR sequence. Otherwise, the determination of the sequence information element is terminated in act 134.

Optionally, following the determination of the repetition of the first pattern $P_1$ in the section $U_1$ of the MR sequence, a further pattern of a further subsection $S_{1,3}$, $S_{1,4}$, $S_{1,5}$ within the section $U_1$ of the MR sequence may be determined and compared with the first pattern $P_1$. In this situation, the further subsection is advantageously selected in randomized fashion.

The pattern recognition in a sequence simulation, (e.g., in the sequence diagram D), may thus be utilized through evaluation of a subselection of sampling points in the sequence diagram D in order to accelerate the estimation of the sequence information element, (e.g., $B_{1,average}$ and/or $B_{1,peak}$). Instead of determining the sequence information element separately for each point in time of the MR sequence a suitable subsection $U_{1,1}$, for example, a certain number of repetition times TR, which for the most part represents the smallest reliably repeating substructure of the MR sequence, may be evaluated and it may be assumed that the pattern $P_1$ is repeated over the range considered here. In this situation, the considered ranges may be section windows $M_1$, $M_2$, $M_3$, as illustrated by way of example in the figure. The sequence information element may be averaged within a section window $M_1$, $M_2$, $M_3$, so that the section windows $M_1$, $M_2$, $M_3$ may also be called averaging windows in this case.

Each of the sections $S_{1,1}$, $S_{1,2}$, $S_{1,3}$, $S_{1,4}$, $S_{1,5}$ in FIG. 4 may correspond to one heartbeat of the patient 15. If the pattern from the first heartbeat is detected and found again in the second TR, then on the assumption of patterns continuing to repeat regularly the sequence information element $B_{1,average}$ may estimate the average value of $B_1$ by way of any averaging window $M_1$, $M_2$, $M_3$ without calculating the sequence information element explicitly over the entire MR sequence.

Finally, it should be noted once again that the methods described in detail in the foregoing and also the evaluation unit and MR device presented are only exemplary embodiments that may be modified in many different ways by the person skilled in the art without departing from the scope of the disclosure. Furthermore, use of the indefinite article "a" or "an" does not mean that the features in question cannot also be present several times. Likewise, the term "unit" does not mean that the components in question cannot include a number of interacting subcomponents, which may in some instances also be spatially distributed.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a sequence information element of a magnetic resonance (MR) sequence, the method comprising:
   receiving, by an evaluation unit, the MR sequence having a plurality of sections, each section of the plurality of sections having at least one subsection;
   detecting a first pattern within a first subsection of a section of the MR sequence, wherein the first pattern comprises a periodic or repeating series of gradient pulses, radiofrequency pulses, or a combination thereof;
   determining a first subsection information element within the first subsection of the section of the MR sequence;
   determining, by the evaluation unit, the sequence information element based on an extrapolation of the first subsection information element to the section of the MR sequence when the detected first pattern is repeated at least once within the section of the MR sequence,
   wherein the determining of the sequence information element avoids an evaluation of the entire MR sequence, therein providing a faster evaluation.

2. An evaluation unit comprising:
   at least one processor; and
   at least one memory including a computer program, wherein the at least one memory and the computer program are configured to, with the at least one processor, cause the evaluation unit to at least perform:
   receive a magnetic resonance (MR) sequence having a plurality of sections, each section of the plurality of sections having at least one subsection;
   detect a pattern within a first subsection of a section of the MR sequence, wherein the pattern comprises a periodic or repeating series of gradient pulses, radiofrequency pulses, or a combination thereof;

determine a first subsection information element within the first subsection of the section of the MR sequence;

determine a sequence information element based on an extrapolation of the first subsection information element to the section of the MR sequence when the detected pattern is repeated at least once within the section of the MR sequence.

3. A magnetic resonance (MR) device comprising:

a system control unit configured to control the MR device; and an evaluation unit having at least one processor and at least one memory including a computer program, wherein the at least one memory and the computer program are configured to, with the at least one processor, cause the evaluation unit to at least perform:

receive a MR sequence having a plurality of sections, each section of the plurality of sections having at least one subsection;

detect a pattern within a first subsection of a section of the MR sequence, wherein the pattern comprises a periodic or repeating series of gradient pulses, radiofrequency pulses, or a combination thereof;

determine a first subsection information element within the first subsection of the section of the MR sequence;

determine a sequence information element based on an extrapolation of the first subsection information element to the section of the MR sequence when the detected pattern is repeated at least once within the section of the MR sequence.

4. The method of claim 1, wherein the sequence information element comprises at least one limiting variable.

5. The method of claim 4, wherein the limiting variable characterizes an absorption rate, a nerve stimulation, or both the absorption rate and the nerve stimulation.

6. The method of claim 5, wherein the limiting variable further characterizes at least one limit of an MR device.

7. The method of claim 4, wherein the limiting variable characterizes at least one limit of an MR device.

8. The method of claim 1, wherein the first pattern is determined based on the first pattern of the MR sequence and a supplementary information element.

9. The method of claim 1, wherein the determination of the sequence information is terminated after a defined time.

10. The method of claim 1, wherein each subsection of the at least one first subsection comprises less than ten repetition times.

11. The method of claim 10, further comprising:

determining a further pattern of a further subsection within the section of the MR sequence following the determination of a repetition of the first pattern in the section of the MR sequence; and comparing the further pattern with the first pattern.

12. The method of claim 11, further comprising:

selecting the further subsection in a randomized fashion.

13. The method of claim 1, further comprising:

determining a further pattern of a further subsection within the section of the MR sequence following the determination of a repetition of the first pattern in the section of the MR sequence; and comparing the further pattern with the first pattern.

14. The method of claim 13, further comprising:

selecting the further subsection in a randomized fashion.

* * * * *